US012688801B2

(12) United States Patent
Jeon et al.

(10) Patent No.: US 12,688,801 B2
(45) Date of Patent: Jul. 21, 2026

(54) FOLDABLE DISPLAY DEVICE INCLUDING A SLIDEABLE PLATE

(71) Applicant: LG Display Co., Ltd., Seoul (KR)

(72) Inventors: Seungo Jeon, Seoul (KR);
Hyeonggwang An, Incheon (KR);
Youngjoon Yun, Goyang-si (KR);
Shinsuk Lee, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/510,361

(22) Filed: Nov. 15, 2023

(65) Prior Publication Data

US 2024/0098916 A1      Mar. 21, 2024

Related U.S. Application Data

(63) Continuation of application No. 17/542,120, filed on Dec. 3, 2021, now Pat. No. 11,856,722.

(30) Foreign Application Priority Data

Dec. 14, 2020     (KR) ........................ 10-2020-0174127

(51) Int. Cl.
*G09F 9/00*          (2006.01)
*G09F 9/30*          (2006.01)
*H05K 5/02*          (2006.01)

(52) U.S. Cl.
CPC ........... *G09F 9/301* (2013.01); *H05K 5/0226* (2013.01)

(58) Field of Classification Search
CPC .... G06F 1/1624; G06F 1/1618; G06F 1/1652; H05K 5/0226; H05K 5/0017
See application file for complete search history.

(56) References Cited

U.S. PATENT DOCUMENTS

| | | | | |
|---|---|---|---|---|
| 9,954,985 B2 * | 4/2018 | Xu | ....................... | H04M 1/0268 |
| 10,143,098 B1 * | 11/2018 | Lee | ........................... | H05K 5/03 |
| 10,297,785 B2 * | 5/2019 | Ahn | ..................... | H04M 1/0268 |
| 10,331,176 B2 * | 6/2019 | Kim | ...................... | G06F 1/1652 |
| 10,433,438 B2 * | 10/2019 | Moon | ................. | H04M 1/0268 |
| 10,466,747 B2 | 11/2019 | Yun et al. | | |
| 10,545,538 B2 * | 1/2020 | Jia | ........................ | H04M 1/0268 |
| 10,694,623 B2 | 6/2020 | Park | | |
| 10,768,667 B2 * | 9/2020 | Lin | ..................... | H04M 1/0268 |
| 10,996,716 B2 * | 5/2021 | Lee | ...................... | H10K 77/111 |
| 11,048,296 B2 * | 6/2021 | Hsu | ........................ | G06F 1/1652 |

(Continued)

FOREIGN PATENT DOCUMENTS

| | | |
|---|---|---|
| CN | 107797610 A | 3/2018 |
| CN | 109308847 A | 2/2019 |

(Continued)

*Primary Examiner* — Rockshana D Chowdhury
*Assistant Examiner* — Douglas R Burtner
(74) *Attorney, Agent, or Firm* — Birch, Stewart, Kolasch & Birch, LLP

(57)          ABSTRACT

A foldable display device includes a display panel having a first area, a second area, and a foldable area between the first area and the second area. The foldable display device further includes a first casing supporting the first area of the display panel, a second casing supporting the second area of the display panel, a slidable plate attached to the second area of the display panel and movably coupled to the second casing, and a hinge coupled to the first casing and the second casing.

18 Claims, 4 Drawing Sheets

(56)                    References Cited

U.S. PATENT DOCUMENTS

| | | | | | |
|---|---|---|---|---|---|
| 11,061,444 | B2 * | 7/2021 | Nakamura | ............... | G06F 1/162 |
| 11,076,499 | B2 | 7/2021 | Jeon et al. | | |
| 11,089,695 | B2 * | 8/2021 | Park | .................... | H05K 5/0017 |
| 11,089,698 | B2 | 8/2021 | Park | | |
| 11,169,565 | B2 * | 11/2021 | Park | .................... | G06F 1/1641 |
| 11,204,627 | B2 | 12/2021 | Park | | |
| 11,243,634 | B2 * | 2/2022 | Ko | ......................... | G06F 3/0446 |
| 11,372,453 | B2 * | 6/2022 | Yu | ............................. | G06F 9/30 |
| 11,516,324 | B2 * | 11/2022 | Park | .................... | H04M 1/0216 |
| 2018/0077810 | A1 * | 3/2018 | Moon | .................. | H05K 5/0086 |
| 2018/0292860 | A1 * | 10/2018 | Siddiqui | ............. | H04M 1/0268 |
| 2019/0032380 | A1 * | 1/2019 | Wu | ........................ | H04M 1/022 |
| 2020/0212325 | A1 * | 7/2020 | Seo | ...................... | H10K 77/111 |
| 2020/0225711 | A1 * | 7/2020 | Pelissier | ............... | G06F 1/1624 |
| 2020/0387195 | A1 | 12/2020 | Kim et al. | | |
| 2020/0409421 | A1 * | 12/2020 | Cho | ........................ | H10K 50/84 |
| 2021/0274028 | A1 * | 9/2021 | Park | .................... | H04M 1/0216 |
| 2021/0307185 | A1 * | 9/2021 | Hong | .................. | H05K 5/0226 |
| 2021/0307186 | A1 * | 9/2021 | Hong | .................. | H04M 1/0216 |
| 2021/0325041 | A1 | 10/2021 | Hou et al. | | |
| 2021/0325941 | A1 * | 10/2021 | Hou | ....................... | G06F 1/1681 |
| 2021/0365072 | A1 * | 11/2021 | Kinoshita | ............. | G06F 1/1616 |
| 2021/0409532 | A1 * | 12/2021 | Lee | ........................ | H05K 1/147 |
| 2021/0410305 | A1 * | 12/2021 | Feng | .................. | H04M 1/0216 |
| 2022/0039277 | A1 * | 2/2022 | Shen | ..................... | G06F 1/1681 |
| 2022/0075414 | A1 | 3/2022 | Park | | |
| 2023/0027462 | A1 * | 1/2023 | Hsu | ....................... | G06F 1/1618 |
| 2024/0275873 | A1 * | 8/2024 | Zhou | ..................... | G09F 9/30 |
| 2024/0414862 | A1 * | 12/2024 | Kim | ........................ | F16C 11/04 |
| 2025/0048571 | A1 * | 2/2025 | Choi | .................... | G06F 1/1681 |

FOREIGN PATENT DOCUMENTS

| | | |
|---|---|---|
| CN | 111261042 A | 6/2020 |
| CN | 111415583 A | 7/2020 |
| KR | 10-2017-0057500 A | 5/2017 |
| KR | 10-2018-0076271 A | 7/2018 |
| KR | 10-2019-0001864 A | 1/2019 |
| KR | 10-2020-0067023 A | 6/2020 |

* cited by examiner

FOLDABLE DISPLAY DEVICE INCLUDING A SLIDEABLE PLATE

CROSS-REFERENCE TO RELATED APPLICATION

This application is a Continuation Application of U.S. application Ser. No. 17/542,120, filed on Dec. 3, 2021, which claims the priority benefit under 35 U.S.C. § 119(a) to Korean Patent Application No. 10-2020-0174127 filed in the Republic of Korea on Dec. 14, 2020, the entire contents of all these applications being hereby incorporated by reference into the present application.

BACKGROUND

Technical Field

The present disclosure relates to a foldable display device, and, more particularly, to a foldable display device that can be folded both in an in-foldable manner and an out-foldable manner.

Description of Related Art

Recently, portable terminals such as wireless terminals, Personal Digital Assistants (PDA) ( ), Portable Multimedia Players (PMPs) ( ), and electronic notebooks have become smaller in size for convenience in portability. However, since a user wants to receive various information such as text information, a moving image, a still image, an MP3, a game, etc., on a screen of a portable terminal, there is an increasing demand for increasing the screen size.

In order to enlarge the screen while maintaining the portability of the portable terminal, development of a foldable display device using a flexible display panel that can be bent or folded is in progress. This foldable display device can be applied not only to mobile devices such as mobile phones, electronic books, and electronic newspapers, but also to various fields such as televisions and monitors, but is not limited thereto.

SUMMARY OF THE DISCLOSURE

A foldable display device according to a related art is implemented only in an in-foldable manner in which the device is folded such that folded display panel portions face toward each other, or only an out-foldable manner in which the device is folded such that folded display panel portions face outwardly (e.g., away from each other). However, there is a need for a foldable display device capable of implementing both an in-folding operation and an out-folding operation for various applications.

Accordingly, the inventors of the present disclosure have invented a foldable display device that can be folded both in an in-foldable manner and an out-foldable manner.

Thus, a purpose of the present disclosure is to provide a foldable display device that can be folded in both in an in-foldable manner and an out-foldable manner.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

In order to achieve the above-described purpose and other objects, a foldable display device according to an embodiment of the present disclosure includes a display panel having a first area, a second area, and a foldable area therebetween; first and second casings for respectively supporting a first area and a second area of a display panel, wherein the first and second casings are coupled to a hinge, a slidable support which has one end movably connected to the first casing and an opposite end fixed to the second casing, wherein the slidable support supports a foldable area of the display panel between the first area and the second area of the display panel during an unfolding operation and an out-folding operation, and a slidable plate attached to the display panel and movably connected to the second casing.

A foldable display device according to another embodiment of the present disclosure includes a display panel having a foldable area; first and second casings for supporting the display panel, wherein the first and second casings are coupled to a hinge; a shape variable support having one end movably connected to the first casing and the opposite end fixed to the second casing, wherein a shape of the shape variable support varies based on an unfolded, in-folded or out-folded state of the foldable display device; and a slidable plate attached to the display panel and movably coupled to the second casing.

A foldable display device according to yet another embodiment of the present disclosure includes a first casing for supporting a first area of a display panel and a second casing for supporting a second area of the display panel; a slidable support having one end movably connected to the first casing and the opposite end fixed to the second casing, wherein the slidable support supports a foldable area between the first casing and the second casing during both an unfolding operation and an out-folding operation of the foldable display device; and a slidable plate attached to the display panel and movably coupled to the second casing, wherein the second casing has a second sliding-guiding groove, and the second sliding-guiding groove accommodates therein the slidable plate and guides a movement of the slidable plate.

Accordingly, the foldable display device according to an embodiment of the present disclosure can perform both the in-folding operation and the out-folding operation.

According to the present disclosure, the foldable display device can include the slidable support movably coupled to the first casing and the slidable plate movably coupled to the second casing. Thus, the foldable display device according to an embodiment of the present disclosure can perform both the in-folding operation and the out-folding operation.

According to the present disclosure, the slidable support can be movably coupled to the first casing, such that the display panel can be stably supported in the unfolded state and the out-folded state.

According to the present disclosure, the slidable plate can be movably coupled to the second casing, and the receiving space can be defined in the second casing. Thus, a stress applied to the display panel can be reduced in the out-folded state and the in-folded state.

Effects of the present disclosure are not limited to the above-mentioned effects, and other effects as not mentioned will be clearly understood by those skilled in the art from following descriptions.

BRIEF DESCRIPTION OF THE DRAWINGS

The present disclosure will become more fully understood from the detailed description given hereinbelow and the accompanying drawings which are given by way of illustration only, and thus are not limitative of the present disclosure and wherein.

DETAILED DESCRIPTION OF THE EMBODIMENTS

Figure 1:
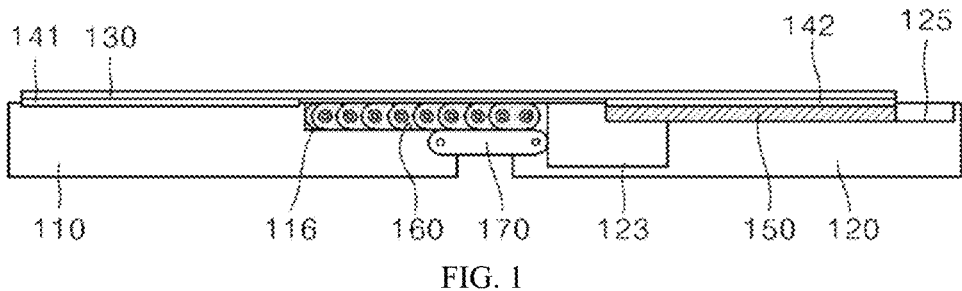
FIG. 1 is a side view of a foldable display device according to an embodiment of the present disclosure as viewed in an unfolded state.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to," or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event can occur therebetween unless "directly after," "directly subsequent" or "directly before" is indicated.

It will be understood that, although the terms "first," "second," "third," and so on can be used herein to describe various elements, components, regions, layers and/or sections, these elements, components, regions, layers and/or sections should not be limited by these terms. These terms may not define order and are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a foldable display device according to some embodiments of the present disclosure will be described. All the components of each foldable display device according to all embodiments of the present disclosure are operatively coupled and configured.

Figure 2:
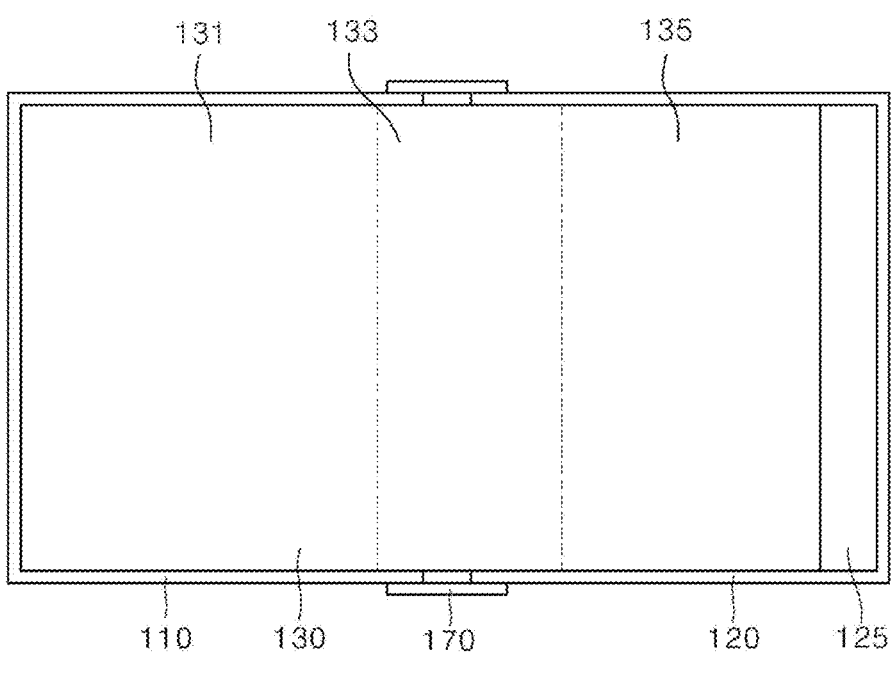
FIG. 2 is a plan view of a foldable display device according to an embodiment of the present disclosure as viewed in an unfolded state.
Figure 3:
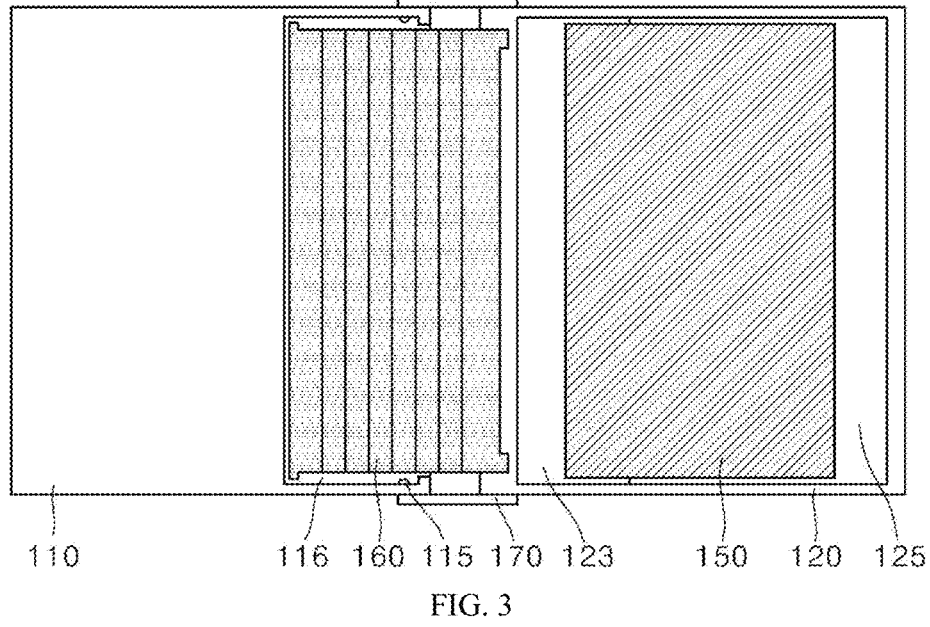
FIG. 3 is a plan view showing a state in which a display panel is removed while a foldable display device according to an embodiment of the present disclosure is unfolded.

FIG. 1 is a side view of a foldable display device according to an embodiment of the present disclosure as viewed in a unfolded state. FIG. 2 is a plan view of a foldable display device according to an embodiment of the present disclosure as viewed in an unfolded state. FIG. 3 is a plan view showing a state in which a display panel is removed while a foldable display device according to an embodiment of the present disclosure is unfolded.

Referring to FIG. 1, the foldable display device according to an embodiment of the present disclosure includes a first casing 110, a second casing 120, a display panel 130, a slidable support 160, a slidable plate 150, and a dual-shaft hinge 170.

The foldable display device includes the display panel 130 having a first area 131, a second area 135 and a foldable area 133 therebetween, the first casing 110 supporting the first area 131 of the display panel 130, and the second casing 120 supporting the second area 135 of the display panel 130, the slidable support 160 having one end (e.g., a first end) movably connected to the first casing 110 and the opposite end (e.g., a second end) fixed to the second casing 120. The slidable support 160 supports the foldable area 133 of the display panel 130, the slidable plate 150 is attached to the second area 135 of the display panel 130 and is movably coupled to the second casing 120, and the hinge 170 is coupled to the first casing 110 and the second casing 120. Further, the hinge 170 extends between the first casing 110 and the second casing 120.

An entire area of the display panel 130 can be divided into the first area 131, the second area 135, and the foldable area 133. The first area 131 can be defined as a partial area of the display panel 130 located on one side of the foldable area 133. The second area 135 can be defined as a partial area of the display panel 130 located on an opposite side of the foldable area 133. When the display panel 130 is unfolded into a flat state, the first area 131, the second area 135, and the foldable area 133 constitute a single display area, thereby providing a wide screen.

The display panel 130 can be embodied as a flexible display panel using a flexible substrate. In one example, the display panel 130 can include a flexible organic light-emitting display panel, a flexible electrophoretic display panel, a flexible liquid crystal display panel, or a flexible electron-wetting display panel.

The display panel 130 can include a flexible pixel array substrate having an active matrix type pixel array, and an encapsulating member protecting the pixel array. The flexible pixel array substrate can be made of a plastic material or can be made of a metal foil. For example, the plastic flexible pixel array substrate can be made of one selected from polyimide (PI), polyethylene terephthalate (PET), polyethylenapthanate (PEN), polycarbonate (PC), polynorbornene (PNB), and polyethersulfone (PES). The pixel array includes a plurality of pixels in each pixel area adjacent to each of intersections between a plurality of gate lines and a plurality of data lines. The pixel includes a display element that displays an image corresponding to an image signal. In this connection, the display element can be embodied as an organic light-emitting element, a liquid crystal display element, an electrophoretic element, or an electro-wetting display element. When the display element is embodied as an organic light-emitting element or an electrophoretic element, an encapsulating member according to one example can be formed on a flexible substrate to cover the pixel array, and can be embodied as a flexible encapsulating substrate or a flexible encapsulation layer. When the display element is embodied as a liquid crystal display element, an electro-wetting display element, or an electrophoretic element, an encapsulating member according to another example can be embodied as a flexible color filter substrate including a color filter corresponding to a pixel.

Additionally, the display panel 130 can further include a polarizing film attached to the encapsulating member. However, the polarizing film can be omitted depending on an image rendering scheme of the display panel 130.

In one example, the foldable display device according to an embodiment of the present disclosure can be configured to further include a touch screen for a user interface using a user's touch, as known in the art. The touch screen can be attached to the display panel 130 or embedded in the display panel 130 together with a pixel array, as known in the art.

A portion of the first area 131 of the display panel 130 is supported by the first casing 110 while being attached to the first casing 110 via a first adhesive member 141. The second area 135 of the display panel 130 is supported by the slidable plate 150 while being attached to the slidable plate 150 via a second adhesive member 142. The slidable plate 150 is supported by the second casing 120. The second area 135 of the display panel 130 is supported by the second casing 120 via the slidable plate 150. In an unfolded state of the foldable display device, the foldable area 133 of the display panel 130 and a portion of the first area 131 can be supported by the slidable support 160.

The first casing 110 can have a first sliding-guiding groove 116 that can accommodate therein at least a portion of the slidable support 160 and can guides a movement of the slidable support 160. One end of the slidable support 160 is slidably movable within the first sliding-guiding groove 116 of the first casing 110. The first sliding-guiding groove 116 can be defined in an inner end area of the first casing 110. The opposite end of the slidable support 160 can be coupled to an inner end area of the second casing 120 via a fastening member such as a pin. The first casing 110 and the second casing 120 can be folded or unfolded while pivoting around the hinge 170. Each of the inner end area of the first casing 110 and the inner end area of the second casing 120 can refer to an area adjacent to the hinge 170. When the foldable display device is unfolded, the inner end area of the first casing 110 and the inner end area of the second casing 120 can be adjacent to each other. In this context, when the foldable display device is unfolded, an outer end area of the first casing 110 and an outer end area of the second casing 120 can be farther from each other (i.e., with respect to when the foldable display device is folded).

The second casing 120 can have a second sliding-guiding groove 125 which can accommodate therein the slidable plate 150 and guide a movement of the slidable plate 150. The slidable plate 150 can slide freely along a guide rail of the second sliding-guiding groove 125. The second casing 120 can further include a receiving space 123 in which the foldable area 133 of the display panel 130 is accommodated during the in-folding operation. The receiving space 123 can be formed in an inner end area of the second casing 120. The second sliding-guiding groove 125 can be formed along an entire area of the second casing 120 and can be connected to the receiving space 123 (e.g., the second sliding-guiding groove 125 may extend into the receiving space 123, as illustrated in FIG. 1). In order to reduce the stress applied to the foldable area 133 of the display panel 130 during the in-folding and out-folding operations, the slidable plate 150 can slide within the second sliding-guiding groove 125. In the unfolded state of the foldable display device, a portion of the slidable plate 150 can be received in the receiving space 123, and an outer end of the slidable plate 150 can be spaced from an outer end of the second sliding-guiding groove 125. In this connection, each of the outer end of the slidable plate 150 and the outer end of the second sliding-guiding groove 125 can mean an end located away from the hinge 170. During the in-folding operation of the foldable display device, the slidable plate moves away from the slidable support, and during the out-folding operation of the foldable display device, the slidable support moves towards the slidable support.

Figure 6:
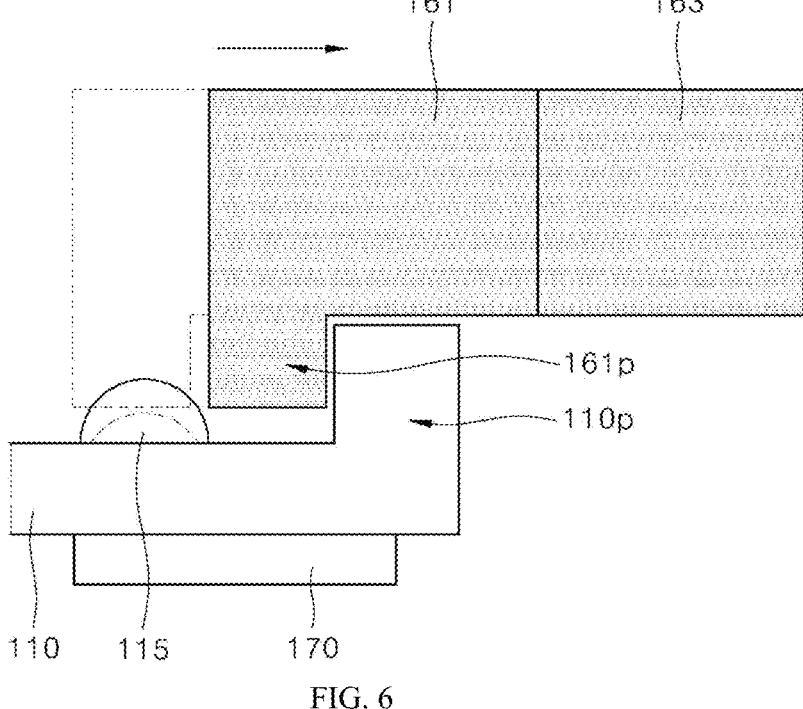
FIG. 6 is an enlarged plan view showing an area A of FIG. 5.

A variable protrusion 115 can be disposed on a side wall of the first sliding-guiding groove 116 adjacent to the inner end of the first casing 110, as shown in FIG. 6. A protrusion dimension of the variable protrusion 115 can vary by an external force. When an external force is applied to the variable protrusion 115, the protrusion dimension thereof can decrease. It is desirable that the variable protrusion 115 has a shape in which the protrusion dimension of the variable protrusion 115 can be reduced when a force is applied in a lateral direction. The variable protrusion 115 can include for example a convex curved surface. However, the present disclosure is not limited thereto. For example, in an out-folding process or in a process in which the out-folded state returns to the unfolded state, the variable protrusion 115 can be pressed by a projection 161p, shown in FIG. 6, of the slidable support 160 moving within the first sliding-guiding groove 116, such that the protrusion dimension thereof can temporarily decrease. The projection 161p may be provided in plural. Further, each projection 161p may extend transverse to an extension direction of the slidable support and may extend from the slidable portion 161 of the slidable support 160.

Figure 4:
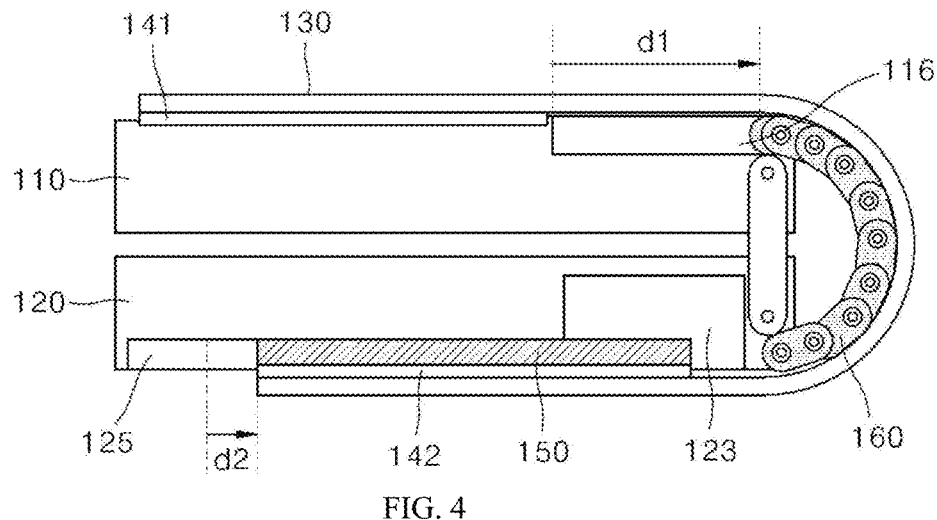
FIG. 4 is a side view of a foldable display device according to an embodiment of the present disclosure as viewed in an out-folded state.
Figure 7:
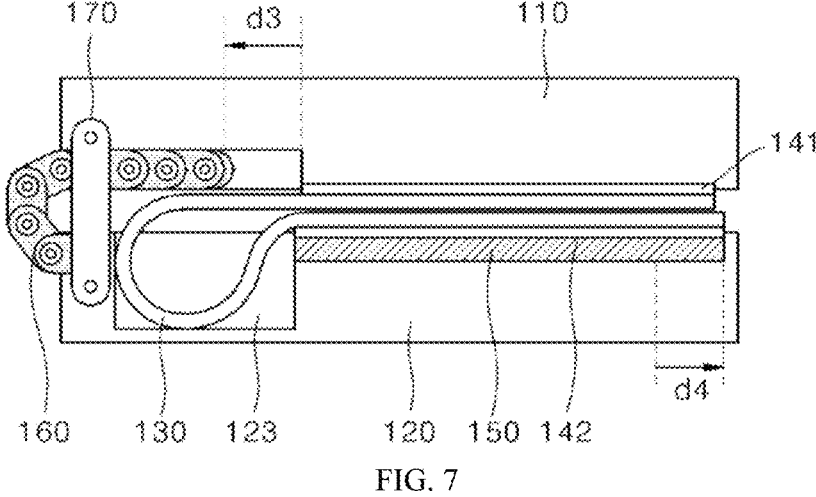
FIG. 7 is a side view of a foldable display device according to an embodiment of the present disclosure as viewed in an in-folded state.

When the slidable support 160 is described in detail with reference to FIG. 8, the slidable support 160 includes a fixed portion 165 that is fixed to the second casing 120, a slidable portion 161 that is movably received in the first casing 110, and an articulation 163 connecting the fixed portion 165 and the slidable portion 161 to each other, and the articulation 163 including a plurality of segments that are connected to each other and may be bent. The plurality of segments may have a first curvature in an out-folded state of the foldable display device that is smaller than a second curvature of the plurality of segments in an in-folded state of the foldable display device. That is, the plurality of segments may have a first radius of curvature in an out-folded state of the foldable display device, as shown in FIG. 4, that is larger than a second radius of curvature of the plurality of segments in an in-folded state of the foldable display device, as shown in FIG. 7. The slidable portion 161 can have the projection 161p protruding from each of both opposing sides, that is, protruding toward each side wall of the first sliding-guiding groove 116. The plurality of segments of the articulation 163 can have the same shape with each other, and can be connected to each other via fastening members such as pins to perform an articulation motion. The slidable portion 161 and the articulation 163 can be pivotally coupled to each other via a fastening member, such as a pin or the like. The articulation 163 and the fixed portion 165 can be pivotally coupled to each other via a fastening member, such as a pin or the like. The fixed portion 165 can be coupled to the side wall of the inner end area of the second casing 120 via a fastening member, such as a pin or the like.

Each of the slidable portion 161 and the segments of the articulation 163 can have a rotation stopper 160p. The rotation stopper 160p can be formed on a bottom face of each of the slidable portion 161 and the segments the articulation 163. Therefore, during the out-folding operation, the components of the slidable support 160 may not rotate in one direction by an angle greater than a predefined angle (e.g., the predefined angle may be smaller than 30 degrees). In the in-folding operation, the components of the slidable support 160 can rotate in the opposite direction to that in the out-folding operation and can rotate by an angle up to 90 degrees.

To support the display panel 130 in the unfolded state and the out-folded state, the fixed portion 165, the slidable portion 161, and the articulation 163 can extend by a length corresponding to a width of the display panel 130. In FIG. 8, only a portion of the slidable support 160 is shown. The slidable support 160 can have a left-right symmetric structure. A shape of the slidable support 160 can vary according to a structural state of the device (unfolded, out-folded, and in-folded states of the device). Therefore, the slidable support 160 can be referred to as a shape variable support.

The hinge 170 has a dual-shaft hinge structure. Thus, the flexible display panel can be folded around two pivoting axes. The dual-shaft hinge can include a plurality of gears so that the first casing 110 and the second casing 120 are folded symmetrically. Alternatively, the dual-shaft hinge can have a combination of a cam structure and a plurality of gears so that the first casing 110 and the second casing 120 are folded by an angle desired by the user, for example, 30 degrees, 60 degrees, 90 degrees, and the like.

A support plate can be attached to a bottom face of the display panel 130. The support plate can include a foldable portion corresponding to the foldable area 133 of the display panel 130. The foldable portion of the support plate can include a plurality of holes. The support plate can include a polymer material filling the plurality of holes. When necessary, the foldable area 133 of the display panel 130 and the foldable portion of the support plate may not be adhered to each other.

Figure 5:
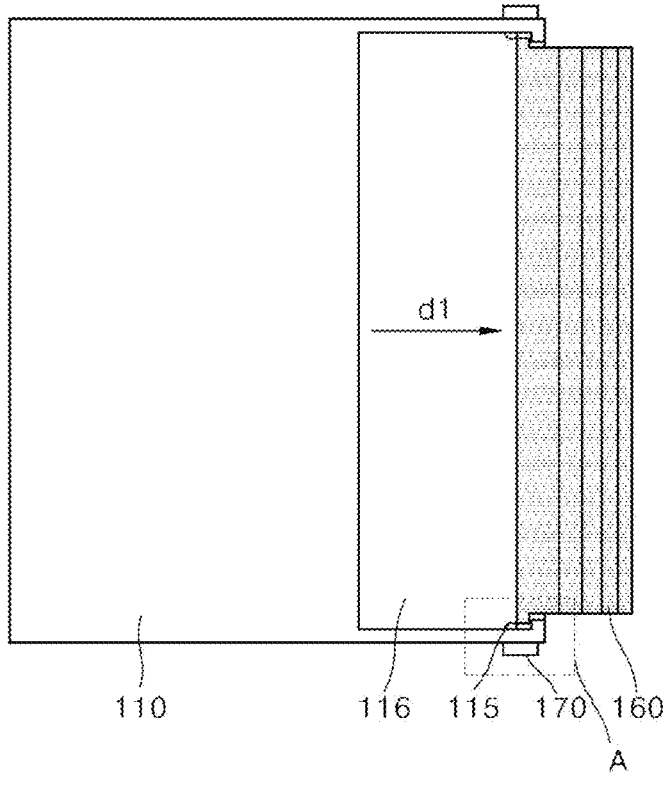
FIG. 5 is a plan view showing movement of a slidable support in an out-folded state of a foldable display device according to an embodiment of the present disclosure.

FIG. 4 is a side view of a foldable display device according to an embodiment of the present disclosure as viewed in an out-folded state. FIG. 5 is a plan view showing movement of a slidable support in an out-folded state of a foldable display device according to an embodiment of the present disclosure. FIG. 6 is an enlarged plan view showing an area A of FIG. 5.

Figure 8:
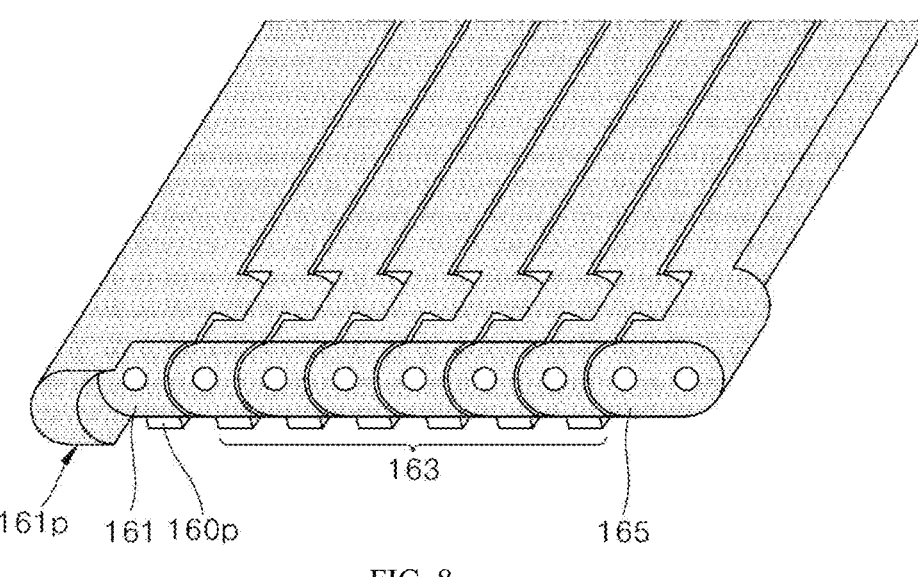
FIG. 8 is a perspective view illustrating a slidable support according to an embodiment of the present disclosure.

Referring to FIG. 4 to FIG. 6, in the out-folded state, one end of the slidable support 160, that is, the slidable portion 161, shown in FIG. 8, moves by a first moving distance d1 toward an inner end of the first casing 110, that is, toward the hinge 170 and within the first sliding-guiding groove 116. The first moving distance d1 means a distance by which the slidable support 160 has moved based on the unfolded state shown in FIG. 1. Since the opposite end of the slidable support 160 is fixed to the second casing 120, the slidable support 160 is pulled toward the second casing 120 during the out-folding process.

During the out-folding process, the display panel 130 can be folded while being supported by the slidable support 160. The slidable support 160 is bent so that the foldable area of the display panel 130 can be supported thereon while a predefined curvature of the foldable area is maintained (e.g., due to being folded). Therefore, the stress generated to the display panel 130 due to non-uniform curvature of the display panel 130 can be minimized. The rotation stopper 160p can be formed on a bottom face of the slidable portion 161 and the bottom face of each of the segments of the articulation 163. Thus, the components of the slidable support 160 may not move by the predefined angle so that the predefined curvature of the foldable area of the display panel 130 can be maintained in the out-folded state. During the out-folding process, the projection 161p of the slidable portion 161 of the slidable support 160 is stopped against a step 110p located on an opening of the first sliding-guiding groove 116, so that the slidable support 160 may not be deviated out of the first sliding-guiding groove 116. The step 110p can protrude from the first casing 110 into the inside of the first sliding-guiding groove 116. Further, the step 110p may extend/protrude towards the slidable portion 161. The variable protrusion 115 can be disposed on a side wall of the first sliding-guiding groove 116 and adjacent to the step 110p. Thus, in the out-folded state, a position of the projection 161p of the slidable portion 161 can be limited to a position between the step 110p and the variable protrusion 115. As the position of the projection 161p of the slidable portion 161 is limited to a position between the step 110p and the variable protrusion 115, the slidable support 160 can be fixed while the predefined curvature thereof can be maintained. Therefore, the slidable support 160 can support the foldable area of the display panel 130 more stably, such that the predefined curvature thereof is maintained.

The protrusion dimension of the variable protrusion 115 can decrease due to the external force (e.g., the variable protrusion 115 may be elastically deformed). Thus, when the out-folded state is removed (e.g., changed) by pivoting the first casing 110 and the second casing 120, the slidable portion 161 can pass by the variable protrusion 115 and move back to the inside of the first sliding-guiding groove 116.

In one example, in the out-folded state, the slidable plate 150 moves toward the inner end of the second casing 120, that is, toward the hinge 170 and within the second sliding-guiding groove 125 of the second casing 120 and by a second moving distance d2. The second moving distance d2 refers to a distance by which the slidable plate 150 has moved based on the unfolded state shown in FIG. 1. The second moving distance d2 of the slidable plate 150 can be smaller than the first moving distance d1 of the slidable support 160. Further, the second moving distance d2 of the slidable plate 150 can be larger than the first moving distance d1 of the slidable support 160. The slidable plate 150 can also play a role of pulling the display panel 130 so that the display panel 130 can be folded while being supported by the slidable support 160. To this end, components, such as a spring or a magnet can be provided between the slidable plate 150 and the second casing 120.

FIG. 7 is a side view of a foldable display device according to an embodiment of the present disclosure as viewed in an in-folded state.

Referring to FIG. 7, in the in-folded state, the first area 131 and the second area 135 of the display panel 130 are folded to face toward each other. The foldable area 133 of the display panel 130 can be accommodated in the receiving space 123 of the second casing 120. At this time, the slidable plate 150 has fully moved into the second sliding-guiding groove 125 of the second casing 120 by a fourth moving distance d4 to open the receiving space 123 so that the foldable area 133 of the display panel 130 can be gently bent into a 'Ω' shape and can be received in the receiving space 123. Since the foldable area 133 of the display panel 130 is gently bent into a shape and is received in the receiving space 123, the stress applied to the foldable area 133 of the display panel 130 can be reduced.

In the in-folded state, the slidable support 160 may not support the display panel 130. The slidable support 160 can be bent and can be disposed between the two shafts of the hinge 170. In this connection, one end of the slidable support 160, that is, the slidable portion 161, shown in FIG. 8, moves by a third moving distance d3 toward an inner end of the first casing 110, that is, toward the hinge 170 and within the first sliding-guiding groove 116, and the components of the slidable support 160 can move in an opposite direction to a movement direction thereof during the out-folding operation. At least some of the components of the slidable support 160, that is, the segments of the articulation 163 can rotate by an angle larger than that during the out-folding operation. Further, the first moving distance d1 of the slidable support 160 can be larger than the third moving distance d3 of the slidable support 160.

In the in-folded state, a curvature of at least some of the components of the slidable support 160, that is, of the articulation 163 can be greater than a curvature of at least some of the components of the slidable support 160 in the out-folded state. An angle formed by a portion of the segments of the articulation 163 of the slidable support 160 in the in-folded state can be smaller than an angle formed by the portion of the segments of the articulation 163 of the slidable support 160 in the out-folded state.

Embodiments of the present disclosure can be described as follows.

A first aspect of the present disclosure provides a foldable display device comprising: a display panel having a first area, a second area, and a foldable area therebetween; a first casing supporting the first area of the display panel; a second casing supporting the second area of the display panel; a slidable support having one end movably connected to the first casing and the opposite end fixed to the second casing, wherein the slidable support supports the foldable area of the display panel during both an unfolding operation and an out-folding operation of the foldable display device; a slidable plate attached to the second area of the display panel and movably coupled to the second casing; and a hinge coupled to the first casing and the second casing.

In one implementation of the first aspect, the first casing has a first sliding-guiding groove defined therein, wherein the first sliding-guiding groove accommodates therein at least a portion of the slidable support and guides a movement of the slidable support.

In one implementation of the first aspect, the slidable support includes: a fixed portion fixed to the second casing; a slidable portion movably received in the first casing; and an articulation for connecting the fixed portion and the slidable portion to each other, wherein the articulation includes a plurality of segments connected to each other and thus capable of being bent.

In one implementation of the first aspect, the slidable portion has a projection, wherein the projection is stopped against a step located on an opening of the first sliding-guiding groove to limit the movement of the slidable support.

In one implementation of the first aspect, each of the plurality of segments has a rotation stopper, wherein a curvature of a curve along the plurality of segments in an out-folded state of the foldable display device is smaller than a curvature of a curve along the plurality of segments in an in-folded state of the foldable display device.

In one implementation of the first aspect, the foldable display device further comprises a variable protrusion disposed on a side wall of the first sliding-guiding groove, wherein a protrusion dimension of the variable protrusion is variable.

In one implementation of the first aspect, the second casing has a second sliding-guiding groove defined therein, wherein the second sliding-guiding groove accommodates therein the slidable plate and guides a movement of the slidable plate.

In one implementation of the first aspect, the second casing further has a receiving space defined therein, wherein the foldable area of the display panel is accommodated in the receiving space during an in-folding operation of the foldable display device.

In one implementation of the first aspect, the second sliding-guiding groove is connected to the receiving space, wherein a portion of the slidable plate is disposed in the receiving space in an unfolded state of the foldable display device.

A second aspect of the present disclosure provides a foldable display device comprising: a display panel having a foldable area; first and second casings for supporting the display panel, wherein the first and second casings are coupled to a hinge; a shape variable support having one end movably connected to the first casing and the opposite end fixed to the second casing, wherein a shape of the shape variable support varies based on an unfolded, in-folded or out-folded state of the foldable display device; and a slidable plate attached to the display panel and movably coupled to the second casing.

In one implementation of the second aspect, a distance by which the shape variable support moves when the foldable display device changes from the unfolded state to the out-folded state is larger than a distance by which the shape variable support moves when the foldable display device changes from the unfolded state to the in-folded state.

In one implementation of the second aspect, the shape variable support includes: a fixed portion fixed to the second casing; a slidable portion movably received in the first casing; and an articulation for connecting the fixed portion and the slidable portion to each other, wherein the articulation includes a plurality of segments connected to each other and thus capable of being bent.

In one implementation of the second aspect, an angle formed by a portion of the plurality of segments during an out-folding operation is greater than an angle formed by a portion of the plurality of segments during an in-folding operation.

In one implementation of the second aspect, the slidable portion has a projection, wherein the projection is stopped against a step formed on the first casing to limit a movement of the shape variable support.

In one implementation of the second aspect, each of the plurality of segments has a rotation stopper.

In one implementation of the second aspect, the foldable display device further comprises a variable protrusion disposed on a side wall of the first sliding-guiding groove, wherein a protrusion dimension of the variable protrusion is variable.

In one implementation of the second aspect, the second casing has a second sliding-guiding groove and a receiving space defined therein, wherein the second sliding-guiding groove accommodates therein the slidable plate and guides a movement of the slidable plate, wherein the foldable area of the display panel is accommodated in the receiving space during an in-folding operation of the foldable display device.

In one implementation of the second aspect, the second sliding-guiding groove is connected to the receiving space, wherein a portion of the slidable plate is received in the receiving space in the unfolded state of the foldable display device.

A third aspect of the present disclosure provides a foldable display device comprising: a first casing for supporting a first area of a display panel and a second casing for supporting a second area of the display panel; a slidable support having one end movably connected to the first casing and the opposite end fixed to the second casing, wherein the slidable support supports a foldable area between the first casing and the second casing during both an unfolding operation and an out-folding operation of the foldable display device; and a slidable plate attached to the display panel and movably coupled to the second casing, wherein the second casing has a second sliding-guiding groove, and the second sliding-guiding groove accommodates therein the slidable plate and guides a movement of the slidable plate.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A foldable display device, comprising:
a display panel having a first area, a second area, and a foldable area between the first area and the second area;
a first casing supporting the first area of the display panel;
a second casing supporting the second area of the display panel;
a slidable plate supporting the second area of the display panel and movably coupled to the second casing;
an adhesive member adhered to the slidable plate on one side and the second area of the display panel on an opposite side to the one side; and
a hinge coupled to the first casing and the second casing,
wherein the slidable plate is entirely disposed inside of the second casing under the second area of the display panel, the slidable plate being configured to move in a horizontal direction,
wherein, in an unfolded state, the slidable plate and the hinge do not contact each other and a top surface of the slidable plate does not overlap a top surface of the hinge in the horizontal direction of the foldable display device, and wherein, in a folded state, a portion of the display panel is located between the slidable plate and the hinge so that the slidable plate does not contact the hinge.

2. The foldable display device of claim 1, wherein the second casing includes a second sliding-guiding groove for guiding a movement of the slidable plate.

3. The foldable display device of claim 2, wherein the second casing further includes a receiving space, and wherein the foldable area of the display panel is accommodated in the receiving space of the second casing during an in-folding operation of the foldable display device.

4. The foldable display device of claim 3, wherein the second sliding-guiding groove extends into the receiving space, and wherein a portion of the slidable plate is disposed in the receiving space in the unfolded state of the foldable display device.

5. The foldable display device of claim 1, further comprising a slidable support having a first end movably connected to the first casing and a second end fixed to the second casing, wherein the slidable support supports the foldable area of the display panel during both an unfolding operation and an out-folding operation of the foldable display device.

6. A foldable display device, comprising:

a display panel having a foldable area;

a first casing supporting a first area of the display panel and a second casing supporting a second area of the display panel, the first and second casings being spaced from one another and supporting the display panel;

a hinge coupled to the first casing and the second casing;

a slidable plate supporting the display panel and movably coupled to the second casing; and an adhesive member adhered to the slidable plate on one side and the second area of the display panel on an opposite side to the one side, wherein the slidable plate is entirely disposed inside of the second casing under the second area of the display panel, the slidable plate being configured to move in a horizontal direction wherein, in an unfolded state, the slidable plate and the hinge do not contact each other and a top surface of the slidable plate does not overlap a top surface of the hinge in the horizontal direction of the foldable display device, and wherein, in a folded state, a portion of the display panel is located between the slidable plate and the hinge so that the slidable plate does not contact the hinge.

7. The foldable display device of claim 6, wherein the second casing includes a second sliding-guiding groove and a receiving space, wherein the second sliding-guiding groove guides a movement of the slidable plate, and wherein the foldable area of the display panel is accommodated in the receiving space of the second casing during an in-folding operation of the foldable display device.

8. The foldable display device of claim 7, wherein the second sliding-guiding groove extends into the receiving space, and wherein a portion of the slidable plate is received in the receiving space in the unfolded state of the foldable display device.

9. The foldable display device of claim 6, further comprising a shape variable support having a first end movably connected to the first casing and a second end fixed to the second casing, wherein a shape of the shape variable support varies based on an unfolded, in-folded or out-folded state of the foldable display device.

10. The foldable display device of claim 7, wherein the second sliding-guiding groove extends at an edge portion of the second casing.

11. The foldable display device of claim 8, wherein the slidable plate is not disposed in the receiving space in an in-folded state of the foldable display device.

12. The foldable display device of claim 8, wherein a portion of the slidable plate is received in the receiving space in an out-folded state of the foldable display device.

13. The foldable display device of claim 2, wherein the second sliding-guiding groove extends at an edge portion of the second casing.

14. The foldable display device of claim 3, wherein the slidable plate is not disposed in the receiving space in an in-folded state of the foldable display device.

15. The foldable display device of claim 3, wherein a portion of the slidable plate is received in the receiving space in an out-folded state of the foldable display device.

16. The foldable display device of claim 5, wherein the slidable support includes a plurality of segments connecting the second end fixed to the second casing to the first end movably connected to the first casing.

17. The foldable display device of claim 16, wherein the plurality of segments are configured to be flat in the unfolded state and have a curvature in the folded state.

18. The foldable display device of claim 16, wherein the slidable support further includes a rotation stopper provided on each of the plurality of segments.

* * * * *